United States Patent [19]

Witt

[11] Patent Number: 5,416,419
[45] Date of Patent: May 16, 1995

[54] INSULATION DEFECT DETECTION BY HIGH VOLTAGE ELECTRODE MEANS

[75] Inventor: George C. Witt, Hillsborough, N.J.

[73] Assignee: AT&T Corp., Murray Hill, N.J.

[21] Appl. No.: 129,516

[22] Filed: Sep. 29, 1993

[51] Int. Cl.[6] .......................................... G01R 31/12
[52] U.S. Cl. ................................. 324/551; 324/515; 324/522; 340/647
[58] Field of Search ............... 324/512, 513, 515, 522, 324/541, 544, 551, 555, 452, 456; 340/647; 379/26

[56] References Cited

U.S. PATENT DOCUMENTS

| | | | |
|---|---|---|---|
| 2,894,204 | 7/1959 | Gambrill | 324/515 |
| 3,413,541 | 11/1968 | Swim et al. | 324/515 |
| 3,491,290 | 1/1970 | Peschel | 324/515 |

FOREIGN PATENT DOCUMENTS

| | | | |
|---|---|---|---|
| 0214373 | 9/1987 | Japan | 324/551 |
| 0750399 | 7/1980 | U.S.S.R. | 324/551 |

Primary Examiner—Kenneth A. Wieder
Assistant Examiner—Diep Do
Attorney, Agent, or Firm—Ruloff F. Kip, Jr.

[57] ABSTRACT

In an apparatus for testing cable (comprising a metallic core jacketed by insulation) to detect localized defects on the insulation caused by its carbonization, the cable is moved in an axial path through an array of five ring electrodes radially spaced from that path and spaced from each other along the path by axial gaps. The first and fifth electrodes from left to right are grounded while high voltage circuits supply current to the middle three electrodes at DC voltages which causes (a) the second and fourth electrode, and (b) the third electrode to be positive and negative, respectively, relative to ground, and which voltages are high enough to produce flow of charge through the atmosphere adjacent the electrodes, and between the electrodes and the moving cable. Means are provided to monitor the current drain by the electrode array and to be responsive to an increase in such current caused by the coming into proximity with the electrode of a defect on the moving cable to produce a warning signal actuating a marker device to produce an ink spot on the cable. Signals caused by increases in such current resulting from traversal at different times by such a defect of separate axial gaps between the electrodes are subject to time delays and are then compared for time coincidence, and their failure to be appropriately time coincident results in non-actuation of the marker device.

12 Claims, 6 Drawing Sheets

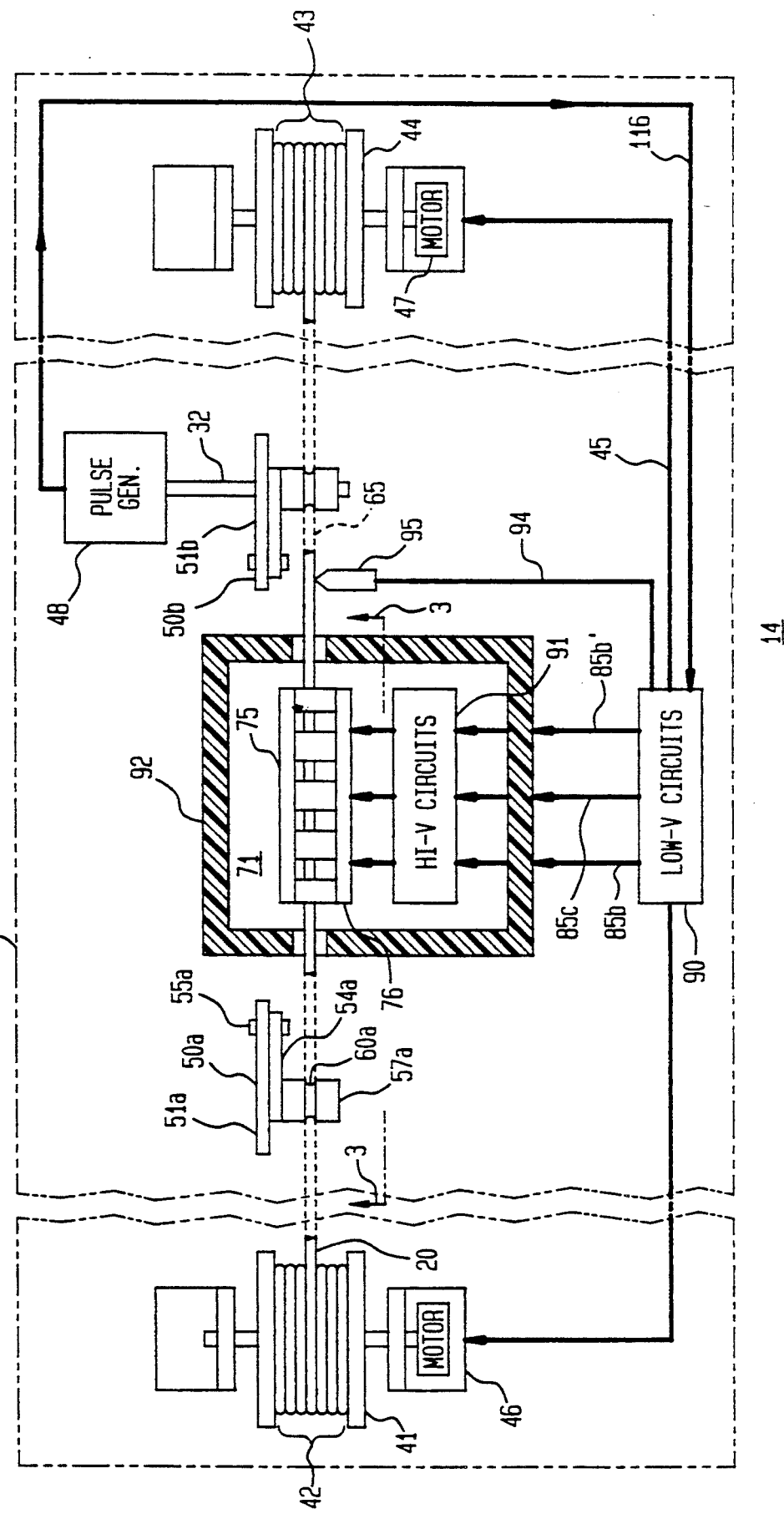

INSULATION DEFECT DETECTION BY HIGH VOLTAGE ELECTRODE MEANS

FIELD OF THE INVENTION

This invention relates generally, to the detection of defects in insulating material and, more particularly, to methods and apparatus for testing filamentary bodies of insulation to detect the presence, if any, thereon of one or more localized regions in which the insulation is defective as indicated by its having a different value for conductivity of electric current than the normal insulation.

BACKGROUND OF THE INVENTION

In the manufacture of telecommunications cable, sheathing for the cable is commonly produced by forcing plastic material through a heated extruder to emerge as a filamentary body of insulation. During such procedure, the extruder occasionally becomes hot enough to produce at the body's surface a defect in the form of a localized nodular region in which the insulation has become partly carbonized to appear as a "black speck". Within that region the conductivity value of the insulation for electric current is, because of its carbonization, much greater than for the normal insulation.

If the cable sheathing has thereon one or more of such specks which are not detected so that they are not removed or otherwise compensated for, the continued presence of such one or more specks in the finished cable may produce signal losses thereon or other detrimental effects in the use of the cable as a medium for conveying information.

SUMMARY OF THE INVENTION

The problem of how to detect the presence of such black specks is solved according to the invention by the use of apparatus and methods of the character set out by the appended claims.

BRIEF DESCRIPTION OF THE DRAWINGS

For a better understanding of the invention, reference is made to the following description of an exemplary embodiment thereof and to the accompanying drawings wherein:

FIG. 2 is a plan view of exemplary apparatus for detecting black specks in the FIG. 1 cable;

Figure 1:
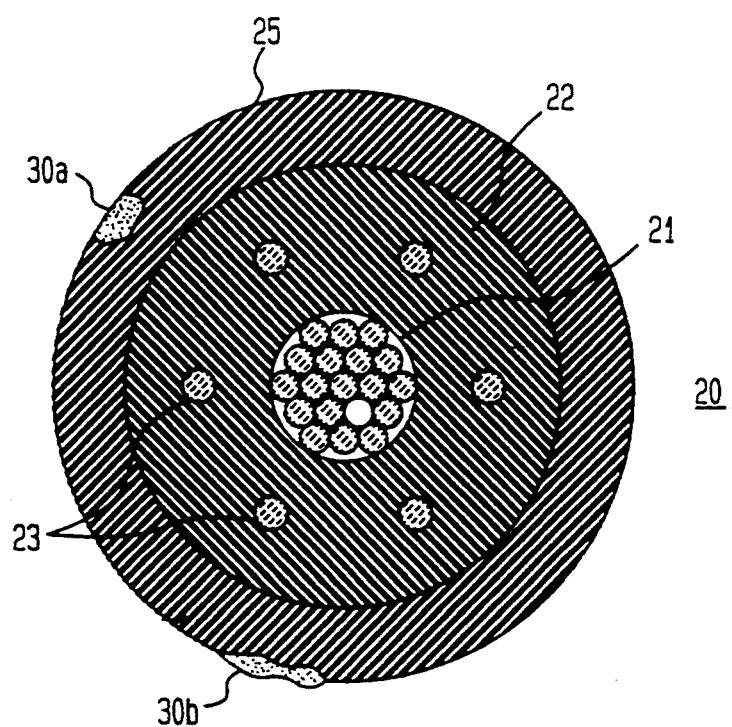
FIG. 1 is a view of a cross-section through a cable which has thereon black specks capable of being detected by apparatus and methods according to the invention.

In the description which follows, elements which are counterparts of each other are designated by the same reference numerals having different alphabetical suffixes to differentiate those elements, and it is to be understood that a description of any one of those elements shall, unless the context otherwise indicates, be taken as also describing any counterparts thereof.

DETAILED DESCRIPTION OF THE EMBODIMENT

Referring now to FIG. 1, the reference numeral 20 designates an optic fiber cable constituting the inner section of a larger submarine cable (not shown). Cable 20 comprises an inner flexible metallic core 21 formed of steel strands, an inner flexible insulating sheath 22 jacketing core 21 and in which is embedded a plurality of optical fibers 23, and an outer flexible insulating sheath 25 jacketing the inner sheath 22. The inner and outer sheaths 22 and 25 are respectively constituted of HYTREL polymeric insulating material 26 and NYLON polymeric insulating material 27, the synthetic words HYTREL and NYLON being registered trademarks of, respectively, the Dow-Corning Corporation and E. I. Dupont de Nemours and Company.

The cable 20, after its manufacture and testing, is included in the aforementioned submarine cable by jacketing the cable 20 in a protective steel strand package and then embedding the resulting article in an outside flexible insulating sheath, neither such package or outside sheath being shown.

The sheath 25 is a thin elongated flexible body of insulation shown in FIG. 1 as having at its surface a plurality of localized nodular defects 30a, 30b therein. The defects 30 are black in appearance and are commonly known as "black specks". Such defects are formed during extrusion of the NYLON insulating material 27 by an overheating of the extruder which causes a local partial carbonizing of the material within the nodular regions 30 and a consequent many fold increase within those regions of the electrical current conductivity of the insulation as compared to that characterizing the normal insulation which has not been carbonized.

The nodule of carbonized material constituting a black speck 30 is much harder and more rigid than the surrounding insulation of sheath 25 and, moreover, is often protuberant above the surface of the sheath. As a result, when the cable 20 is jacketed as just described by the steel strand package, the black speck 30 is pressed by that package down into the sheath 25 to create in the cable 20 a localized anomalous inward pressure which may well be communicated to one or more of the optical fibers 23 to produce signal losses therein. A black speck 30 may also produce other mechanical and/or electrical problems in the use of the submarine cable of which cable 20 provides the inner section. For that submarine cable to be acceptable therefor, it is necessary for any black specks 30 on cable 20 to be removed or otherwise compensated for. In order to do so, however, it is necessary for the black specks 30 to be detected, and such detection is accomplished according to the invention by apparatus of the following character.

Referring to FIG. 2, the reference numeral 14 designates a testing apparatus comprising a supply reel 41 on which is wound a coil 42 of cable 20 extending lengthwise from reel 41 to another coil 43 of the cable, the latter coil being wound on a take-up roll 44 spaced from reel 41 and separated from it by a platform 45. The reels 41 and 44 are respectively rotatable by the reversible electric motors 46 and 47.

Figure 3:
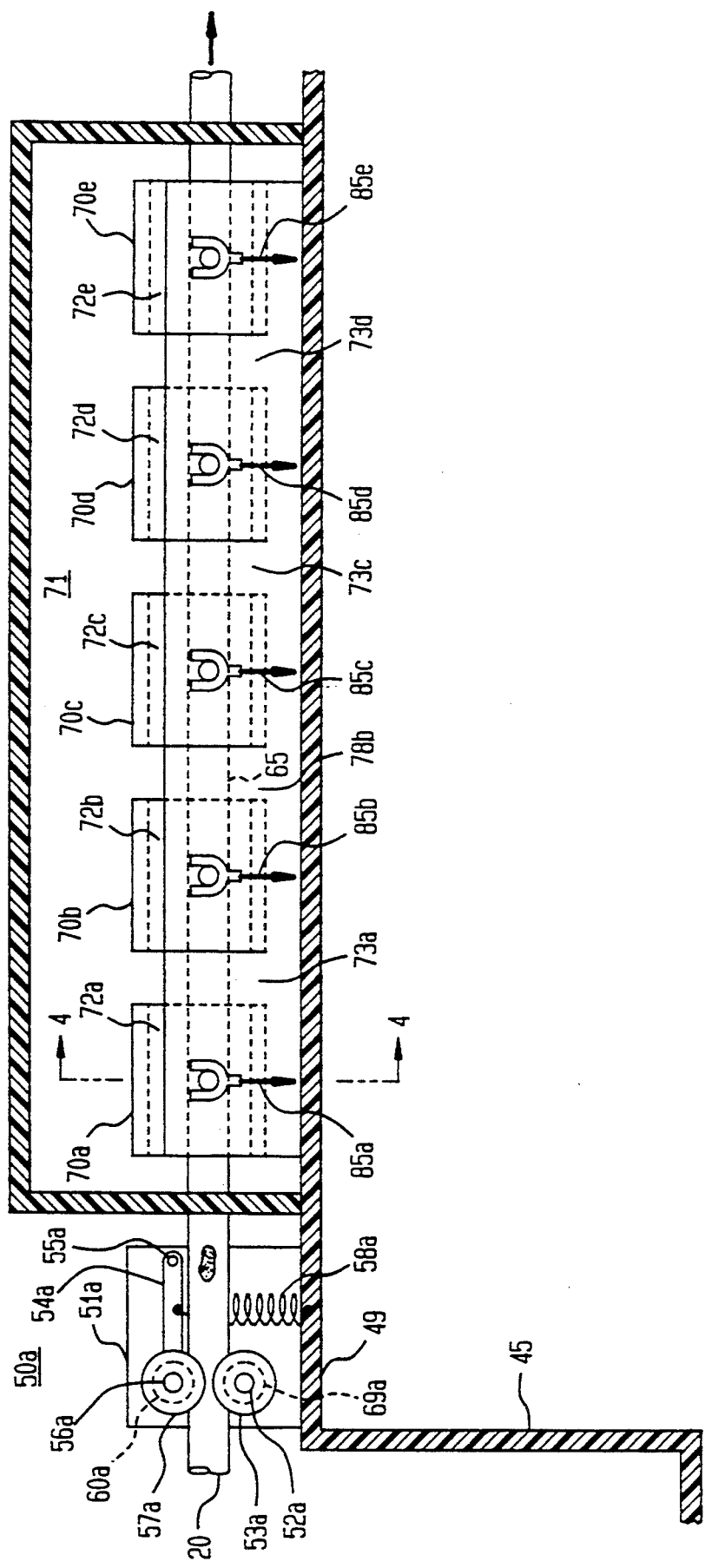
FIG. 3 is an enlarged front elevation in cross-section, taken as indicated by the arrows 3—3 in FIG. 2, of the middle section of the FIG. 2 apparatus.

The platform 45 on its top 49 has mounted entrance and exit cable guides 50a and 50b disposed in spaced relation between reels 41 and 44 in the longitudinal horizontal dimension separating these reels so that guides 50a and 50b are nearer to, respectively, reel 41 and reel 44. Cable guide 50a comprises a stand 51a which is mounted by and extends upward from top 49, and from which transversely projects in the horizontal plane a rotatably stationary arbor shaft 52a (FIG. 3) on which is rotatably mounted a lower roller 53a by ball bearings (not shown) in the roller. Stand 51 a also supports an arm 54a having a constrained end pivotably coupled by pin shaft 55a to the stand and having, also, a free end from which transversely projects another rotatably stationary arbor shaft 56a on which an upper roller 57a is rotatably mounted by ball bearings (not shown) in the roller. The upper roller 57a overlies the lower roller 53a and is urged towards that lower roller by a tension spring 58a connected between arm 54a and the top 49 of platform 45. The rollers 53a and 57a have roller surfaces which are, in general, circular cylindrical but which have formed therein respective concave registering guide grooves 59a, 60a extending circumferentially around the rollers.

The exit cable guide 50b is generally of the same construction as the entrance cable guide 50a with the following differences. In the guide 50b, the lower roller is rotatably fixedly mounted on the front end of a rotatable shaft 32 journaled in and transversely extending through the stand 51b. The rear end of shaft 32 is coupled to a pulse generator 48 adapted to produce a succession of pulses of which the number, as measured from a reference "zero" pulse is proportional to the angular displacement undergone by lower roller 53b since the time of occurrence of that zero pulse. With, however, the cable 20 running over roller 53b and assuming no slippage between them, that angular displacement of the roller is proportional to the linear forward displacement of the moving cable from that time of occurrence, whence the number of such pulses generated over any given time interval is a proportional measure of the forward advance of the moving cable over that time interval.

During the set-up of apparatus 14, the upper roller 57a (FIG. 3) is pulled upward and away from lower roller 53a against the urging of spring 58a, the free end of cable 20 (which is not then wound on take-up reel 44) is passed longitudinally forward between the rollers, and the upper roller is then released so that the cable is gripped between the rollers 53a and 57a and seated in the grooves 59a, 60a thereof. The seating of cable 20 in those grooves fixes at entrance guide 50 a the transverse horizontal position of cable 20 and the pressing by upper roller 57a of the cable against the translationally stationary lower roller 53a fixes at entrance guide 50 a the vertical position of the cable.

Figure 8:
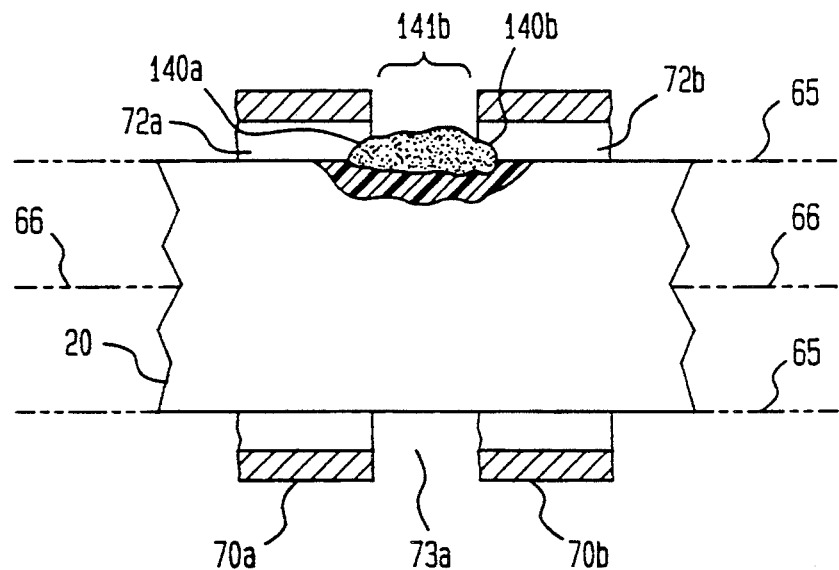
FIG. 8 is a diagram of two adjacent electrodes of the FIG. 2 apparatus when a black speck on the FIG. 1 cable is traversing the axial gap between those electrodes.

In the apparatus 14, the lower and upper rollers of exit guide 50b and the registering concave grooves in those rollers similarly serve to fix at the location of guide 50b the horizontal transverse and vertical positions of the cable gripped in that guide. Hence the guides 50a and 50b together define for the cable 20 a predetermined path 65 over an extent of the distance between reels 41 and 44, for lengthwise movement of the cable between these reels. If desired, other instrumentalities in addition to or in place of the guides 50a, 50b may be utilized in order to assure that path 65 has a positioning with regard to that platform 45 which is firmly fixed and predetermined in relation to platform 45. Such defined path 65 has an axis 66 (FIG. 8) which coincides with the centerline of the path, and which is linear when that path is linear (FIG. 2) but which may have a curvature if the path is defined in such a manner as to have a curvature.

After the free end of cable 20 has been passed through entrance guide 50a, as earlier described, but before it is passed through the exit guide 50a, the cable is led through ring electrode means comprising (FIG. 3) one or more of ring electrodes 70a, 70b, 70c, 70d, 70e in a longitudinal array 71 thereof disposed between the two guides 50. The electrodes 70 are in the form of circular cylindrical copper or aluminum rings which are of the same size and shape, and which are distributed along the cable path 65 to all be coaxial with the path axis 66 and be spaced from the cable path 65a by respective radial gaps 72a–72e extending angularly around the electrodes 70a–70e, and to be spaced from each other by axial gaps 73a–73d shorter than the respective lengths along that path of the electrodes.

The array 71 of electrodes is mounted above platform 45 by a pair of transversely spaced insulative support plates 75, 76 fastened at their bottoms to the platform and extending upwardly therefrom to be coupled at their tops to the electrodes 70 in the manner exemplified for all of them by the coupling together of those plates and electrode 70a which is as follows.

Figure 4:
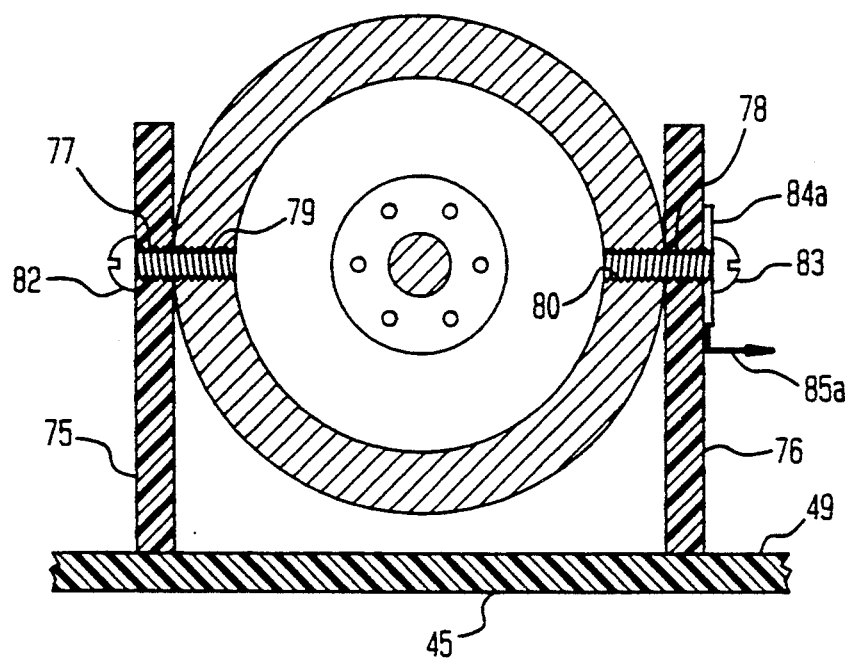
FIG. 4 is a left side elevation in cross-section, taken as indicated by the arrows 4—4 in FIG. 3, of one of the ting electrodes (and the supports therefor) shown in FIG. 3.

Referring to FIG. 4, the plates 75, 76 have formed therein respective unthreaded holes 77, 78 disposed directly opposite each other at a height above platform 45 greater than the radius of the electrode 70a. Corresponding to those unthreaded holes in the plates 77, 78 are two threaded holes 79, 80 formed in the electrode 70a to be diametrically opposite each other and to extend radially through electrode 70a from its exterior surface partly or wholly to its interior surface. Screws 82, 83 pass through, respectively, the unthreaded holes 77, 78 in the plates 75, 76 to be threadedly received in, respectively, the holes 79, 80 in electrode 70a. The screws 82, 83 thus couple that electrode to plates 75, 76 and fix its position relative to the plates when the screws 82, 83 are tightened. The angular position of electrode 80a relative to plates 75, 76 may be more definitely fixed by providing in one of the plates and in the electrode 70a, at the same height as the holes 77–80 but at a distance therefrom, another combination (not shown) of an unthreaded hole in that plate and a registering threaded hole in the electrode, and by passing a screw (not shown) into that combination to additionally lock the plate and electrode together at the location of that combination.

The screw 83 serves not only to mechanically couple electrode 70a to the plate 76 but also to provide part of an electrical coupling thereof. To wit, disposed between the outside of plate 76 and the head of screw 83 is a metallic spade tip 84a which is gripped between the plate and screw by the tightening of the latter to be electrically coupled to electrode 70a through the screw, and which spade tip terminates one end of a lead 85a for supplying to that electrode an electrical potential as will be later described.

The other electrodes 70b–70e are mechanically coupled to support plates 75, 76 and are electrically coupled to, respectively, corresponding leads 85b–85e (FIG. 3) in the same way as electrode 70a is mechanically coupled to these plates and to its lead 85a.

The test apparatus includes electrical energizing means for the electrodes 70b–70d, such energizing means being divided (FIG. 2) into low voltage circuits 90 and high voltage circuits 91. DC potentials of high magnitude relative to ground are generated by the circuits 91 and transmitted through leads 85b–85d to the electrodes 70b–70d. To prevent inadvertent contact with elements of the test apparatus having high voltage thereon, an insulative cover 92 is provided which normally fits over the electrode array 71 and the high voltage circuits 91, but which can be removed when access is needed to a component normally inside the cover.

Another feature of the test apparatus is a marker device 95 which is disposed at a position beside the cable near a point "r" (FIG. 5) spaced away from the exit end of the electrode array 71 in the direction of forward movement of cable 20 towards take up reel 44. Marker 95 is responsive to an electrical warning signal, applied thereto via lead 94, to eject a small quantity of ink towards moving cable 20 to produce an ink mark on its surface near to the defect thereon the presence of which is indicated by the warning signal.

Figure 5:
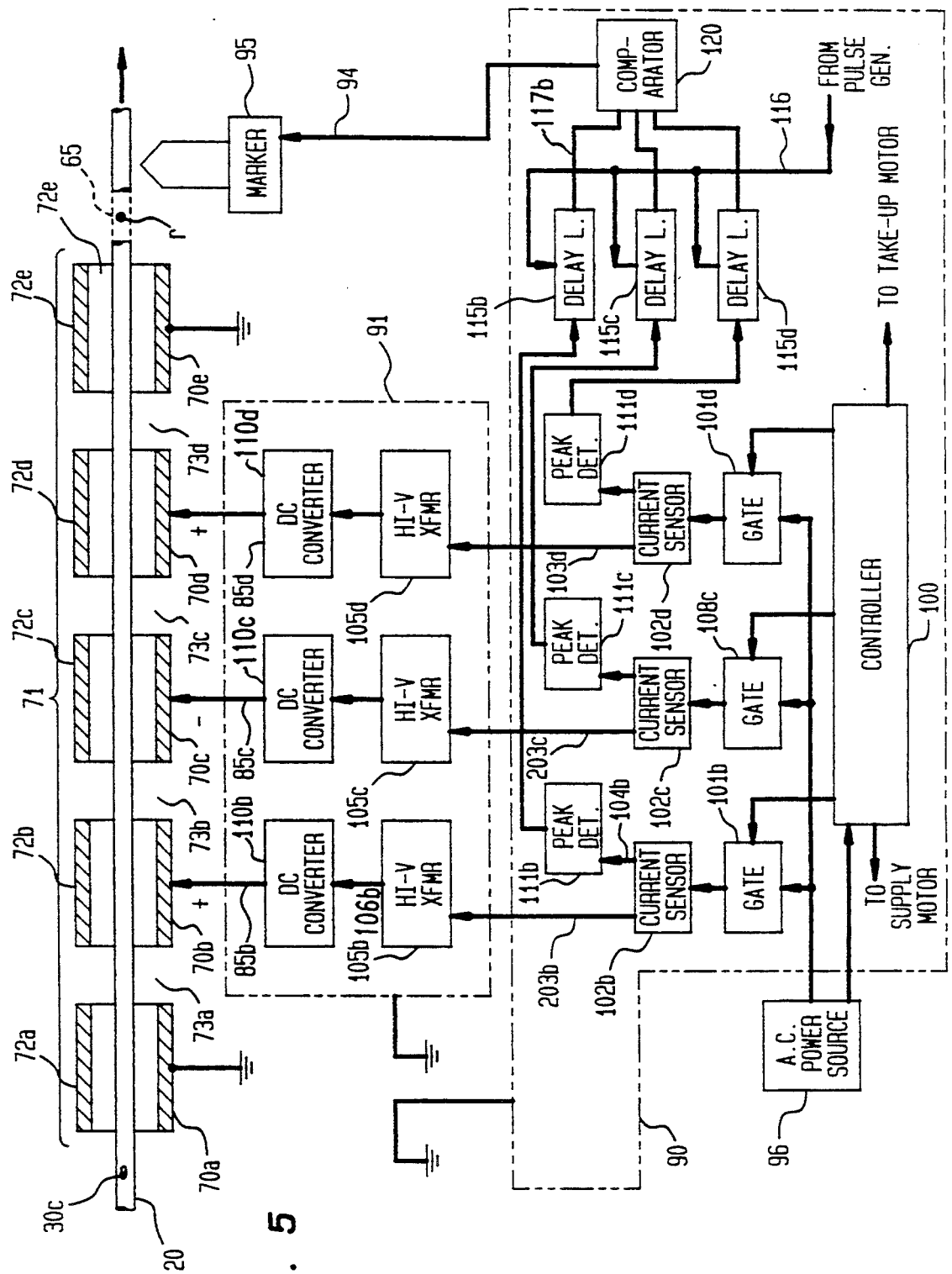
FIG. 5 is a plan view showing details of the electrical circuitry depicted more generally in FIG. 3.

Referring now to FIG. 5, the testing apparatus 14 receives electrical energy for its operation from an AC power supply 96 which is not part of the apparatus 14 and which may, be, a standard wall outlet for 110 volt or 220 volt AC power from the local public utility. The power from source 96 is supplied to the low voltage circuits 90 and within those circuits to a controller 100 later described in more detail and, also, to the inputs of three electrical energizing circuits for respectively the ring electrodes 70b–70d. Of these three circuits only the circuit for electrode 70a will be described in detail.

The last-named circuit comprises a switching gate 101b which, when "on" feeds low voltage power from source 96 to a current sensor unit 102b and which conducts that power therethrough and then, via lead 103b, to the high voltage circuitry 91. Sensor unit 102b also provides on lead 104b an electrical output signal indicative of the magnitude of the current component of the electrical energy conducted through unit 102b.

The current in lead 103b is supplied in high voltage circuitry 91 to the low voltage side of a voltage step-up transformer 105b which responds to the low voltage energy input thereto to provide, on its output side, electrical energy in the form of low magnitude current at an AC voltage which is very high in the sense that its magnitude is many times the magnitude of the AC voltage provided from source 96. That low current high voltage AC energy is conducted by lead 106b to a DC converter unit 110b comprising a plurality of rectifier-capacitor circuits coupled together in cascaded relation in a well-known manner to convert the voltage of the electrical energy supplied thereto from AC to DC, and to serve as a voltage quadrupler or higher order voltage multiplier, such that the output of the converter is electrical energy in the form of low DC current at a DC voltage of a magnitude which is many fold the peak magnitude of the AC input voltage to the converter. That low current high voltage DC energy is supplied via lead 85b to the ring electrode 70b.

Returning to the low voltage circuits 90, the electrical output signal of current sensor unit 102b on lead 104b is applied to a peak detector unit 111b which is thresholded to respond to that signal only when its magnitude exceeds a predetermined set value. When peak detector unit 111b does so respond it produces a peak signal in the form of a pulse which is supplied as one input to a delay line 115b of which another input thereto are the timing pulses supplied thereto via a lead 116 from pulse generator 48. Delay line 115b may take the form of a shift register within which a pulse from peak detector 111b is stepped through the stages of the register at the pulse repetition rate of the timing pulses to the register. Such register is pre-set so that when a preselected number of such timing pulses have been received thereby, the pulse in the register from peak detector 111b is outputted from the register as a delayed peak signal to be supplied via lead 117b to a comparator unit 120. As later explained in more detail, comparator 120 responds to the attainment of certain conditions by the outputs from delay line 115b and those associated with the ring electrodes 70c and 70d to actuate marker 95 to mark cable 20 with an ink spot as earlier described.

The energizing circuits for those electrodes 70C and 70d are similar to the energizing circuit just described for electrode 70b with the exception that, while the magnitudes of the high DC voltages supplied to, respectively, the three electrodes 70b, 70c, 70d is of the same value for all those electrodes, the voltage on electrode 70c is of negative polarity whereas the voltage on, respectively, electrodes 70b and 70d are voltages of positive polarity.

The controller 100 in the low voltage circuits 90 is a software-controlled programmable unit having the role of orchestrating the various operations and functions taking place in apparatus 14 during testing of a cable 20. Among those functions are controlling the energization and direction of rotation of the reversible reel motors 46 and 47 and switching the gate circuits 101b–101d between "on" and "off" so as, selectively, have high DC voltage either applied to or removed from a selected one, some or all of the electrodes 70b, 70c and 70d. Additional functions may be assigned to the controller. For example, the delay and comparison functions shown as performed by delay lines 115b–115d and comparator 120 may readily be performed instead by the program controlled digital circuits of the controller.

The leading and lagging electrodes 70a and 70e of the electrode array 71 have no voltage applied thereto by circuits 90 and 91. Instead those electrodes are grounded by being directly connected, through the leads 85a and 85e to the ground and, further, are connected only through ground to the circuits 90 and 91.

USE OF EMBODIMENT

The described apparatus 14 is used to test a cable 20 and detect therein defects of the kind described in the following manner.

With a length of the cable 20 at its free end being extended from supply reel 41 (FIG. 2) and passed through guides 50a, 50b and electrode array 71, and gripped between the two rollers in each of those guides, all as earlier described, the free end of the cable is further advanced and attached to take up reel 44. The controller 100 then turns on switching gates 101b–101d to cause the corresponding electrodes 70b–70d to be supplied with electrical energy at a high DC potential which is positive (FIG. 5) for electrodes 70b and 70d and negative for electrode 70c. The controller is then actuated to energize motor 47 in the forward direction to rotate take-up reel 44 to pull cable 20 to cause it to unwind from the supply reel and move forward (rightward in FIG. 2) and wind up on reel 44. Simultaneously, the motor 46 for the supply reel 41 is caused by the controller to have a low reverse energization so as to act as a yieldable brake or drag on the forward movement of the cable. Under those conditions the moving cable is placed under moderate tension to be caused by that tension to extend in a straight line between the guides 50a, and 50b. Under those conditions, the length of cable 20 between those guides occupies and is constrained to remain in the described path 65 for that cable which has a predetermined fixed position relative to the electrode array 71, and around which path the electrodes in that array extend so as to each be spaced all around by a radial gap from the taut cable 20 in that path. Also under those conditions, the take up reel 44 and the motor 47 therefor serve as a means to produce lengthwise movement of the cable 20 in path 65.

Considering now the operation of the electrode array 71, at times when the cable 20 is not in its path 65 but the electrodes 70b–70d in the array are energized, the array is in ready condition. At those and all other times, the first electrode 70a, being grounded, is not an active originator of an electrostatic field but, as later more explained, has a significant role as a recipient metallic terminus for an electrostatic field originated by the next adjacent electrode 70b.

Because of the high DC positive voltage relative to ground which is supplied, as earlier described to electrode 70b, that electrode is an originator of an electrostatic field 130b (FIGS. 6 and 7) which emanates from the electrode into the surrounding atmosphere. The voltage on electrode 70b is high enough to cause flow of electrical charge (carried by electrons and other charged particles) through that atmosphere between the electrode 70b and adjacent elements which can accumulate or conduct charge. Where there is such a flow of charge, it is supported by flow of DC current to electrode 70b from converter 110b, which flow in turn causes a greater but substantially proportional flow of AC current to be drawn by transformer 105b through current sensor 102b from AC power supply 96.

Figure 6:
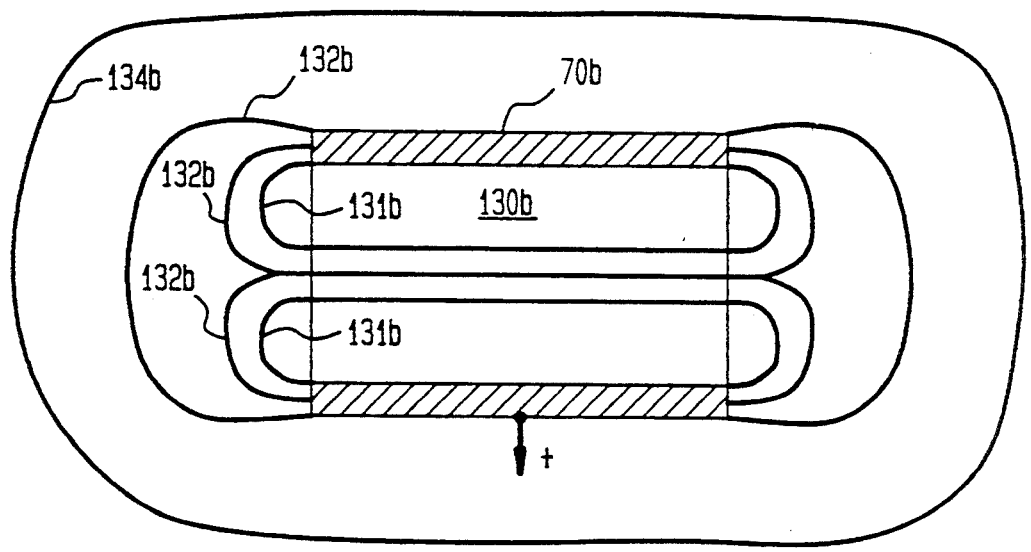
FIG. 6 is a diagram of the magnitudes of the electrostatic field produced in the use of the FIG. 2 apparatus by one of the electrodes thereof in the absence of the electrode being threaded by the FIG. 1 cable.

FIG. 6 is a depiction of the character such field 130b would have when neither cable 20 nor anything else passes through the electrode 70 and when the electrode array 71 consists only of electrode 70b so that it has no other electrodes adjacent thereto. The field 130b as represented in FIG. 6 is characterized by a number of equipotential contour surfaces 131b–134b which are each normal at each point thereon to the electric field lines (not shown) emanating from electrode 70b, and which indicate by their spacing from each other the value of the voltage gradient of the field. In FIG. 6, the contours 131b–134b are spaced relatively far apart to indicate that field 130b has a weak voltage gradient, and the contours show that, at the ends of electrode 70b, the field billows axially outwards from the electrode. While FIG. 6 indicates the configuration of field 130b when nothing is inside electrode 70b, that configuration would not be much changed by the passing through the electrode of a filamentary body of insulation lacking the core 21 of cable 20 or an equivalent core since the dielectric constant of that body would not be much different from that of the atmosphere filling in FIG. 6 the entire interior of the electrode.

Figure 7:
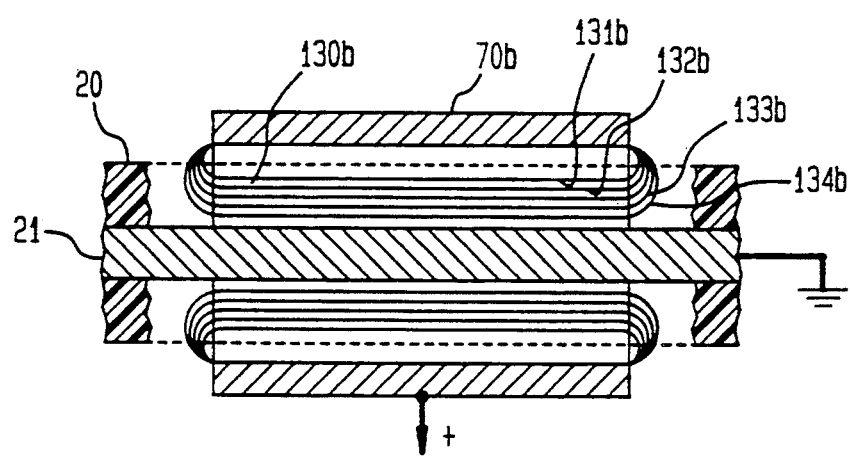
FIG. 7 is a diagram of said electrostatic field when such electrode is threaded by the FIG. 1 cable.

FIG. 7 depicts the configuration of field 130b when, as before, the electrode array 71 consists only of the electrode 70b, but when the cable 20 with its metallic core 21 is inside the electrode. Even though core 21 is insulated by the sheaths 22 and 25 (FIG. 1) of cable 20, because of the great length of the cable, the fact that the radial current conductivity of those sheaths is in proportion to their length, and the fact that core 21 can be directly grounded at its free ends, the core 21 provides, in circumstances of FIG. 7, a virtual ground. The effect of having such ground is to cause many of the field lines of the field 130b from electrode 70b to terminate on core 21 so as, compared to the configuration for that field depicted in FIG. 6, to cause the field to be directed more radially inward towards the center of electrode 70b and the cable path 65 and to increase considerably the voltage gradient of the field.

The described changes made in the character of the field 130b by the presence in electrode 70b of the virtually grounded core 21 of cable 20 are factors which greatly increases flow of charge between the electrode and the cable across the radial gap between them as compared to what such flow would if the core were not present. Accordingly, the inclusion of a metallic core in a cable being tested for defects in its insulatory sheathing increases the efficiency in the use of one or more ring electrodes to detect such defects when the ability to so detect them depends in whole or part upon the transfer to and from the surface of the cable of charge stored on that surface, such ability being enhanced in proportion to the rate of flow from the electrode to the cable of charge which is subsequently so stored. Thus where a ring electrode means consisting of only a single ring electrode (such as electrode 70b) is used according to the invention to detect defects in the insulatory sheathing of cable 20 or other iliamental body of insulation, the use for that purpose of such single electrode is made much easier by the presence in that iliamental body of a virtually grounded metallic core.

Preferably, however, the ring electrode means used to detect such defects comprises an array of two more ring electrodes separated from each other by one or more axial gaps and having in use a voltage differential between the respective high DC voltages on adjacent ones of such two or more electrodes. Electrodes 70a and 70b have that relationship when the electrode array 71 is in ready condition. To wit, while electrode 70a is at that time (and at all other times) at ground potential, electrode 70b is at a high positive DC potential relative to ground so that a voltage differential of the same magnitude exists between electrodes 70b and electrode 70a. That voltage differential causes the field 130b to extend across the axial gap 73a to in turn produce a flow of charge across that gap from electrode 70b to electrode 70a and a consequent drawing of current by electrode 70b, from its DC converter unit 110b, to support that flow of charge.

When electrode array 71a is in ready condition, there is also a voltage differential between the high DC voltages on, respectively, the electrode 70b and the electrode 70c on the side of 70b away from electrode 70a. Because the respective voltages on electrode 70b and 70c are of the same magnitude but of opposite polarity relative to ground, the voltage differential between electrodes 70b and 70c is twice that between the electrodes 70b and 70a. Such "double value" voltage differential causes the electrostatic field 130b originated by electrode 70b to extend across the axial gap 73b between those last named electrodes so as to cause flow of charge from electrode 70b across that gap to electrode 70c, and a consequent drawing by electrode 70b of more current from its converter 110b to support that last named flow of charge.

From the description so far pertaining to energized electrode 70b, it will be evident that, when electrode array 71 is in ready condition, its other energized electrodes 70c and 70d will be linked by the electric fields respective thereto with, in the case of 70c, the adjacent electrodes 70b and 70d and, in the case of 70d, its adjacent electrodes 70c and 70e, the electrode 70e being grounded. Because electrodes 70c, and 70d are so linked, charge will flow from each of those electrodes to their adjacent electrodes, and the electrodes 70c and 70d will draw current from their converters 110c and 110d to support such flows of charge. Because, however, the cable 20 is not then positioned within electrode array 71, the above described flows of charge within that array and the resulting flows 135a, 135b, 135c (FIG. 9) of current to the energized electrodes 70b, 70c, 70e are background or "leakage" flows having no significance for the purpose of the detection of defects to be performed by apparatus 14.

Further to the foregoing, while those background or leakage flows of charge and current have been described on the assumption that the electrode array 71 is in a ready condition for which the array does not contain the cable 20, as long as that cable is not moving, its presence within the electrode array makes no significant difference in those background flows of charge and current except for a transitory period during which the cable is being inserted into the array.

Another step undertaken in preparing the apparatus is to set the delay lines 115b, 115c, 115d to each provide a "delay" corresponding to a predetermined axial distance along path 65 to a fixed reference point "r" (FIG. 5) at a position in that path between electrode 71 and marker 95 but closer to the location of the marker device. Specifically, lines 115b, 115c and 115d are set to have delays respectively corresponding to the distance from point "r" to the centers of, respectively, the axial gaps 73a, 73b, and 73c which respectively precede the energizable electrodes 70b, 70c and 70d.

Returning to the circumstance in which apparatus 14 is fully prepared to perform its testing and detecting functions, and the rotating take up reel 44 and motor 47 are moving cable 20 in its path 65 through the electrode array 71, the movement of the cable through the array produces the following electrical effects so long as no defect 30 on the cable passes through the array. Before a portion of the cable enters the array, the surface of that portion is not likely to have any significant charge thereon, and it is assumed that it has no such charge. The passage of that portion through the grounded electrode 70a and the following axial gap 73a between electrodes 70a and 70b has no electrical effect. As, however, that cable portion enters positively energized electrode 70b, positive charge flows from the electrode to the surface of that portion across the radial gap 72b therebetween so that an accumulation of such charge progressively builds up on that surface. Concurrently, the current 136b (FIG. 9) drawn by electrode 70b to support the flow of charge to the cable portion is above the background value for that current. With further movement of the cable, the build up of charge on that cable portion continues until either saturation is reached in that build up or such portion starts to traverse the gap 73b between electrodes 70b, 70c. In either case, as that cable portion crosses gap 73b and enters and progresses through electrode 70c, the positive charge on the portion is stripped off and replaced by negative charge by the effect on that portion of the negative voltage field emanating from electrode 70c. Fluctuations similar to those just described occur for the charge on that particular cable portion as it passes through electrode 70d to again be charged positive to lose some of that positive charge. The point is that, since movement of that particular cable portion through electrode array 71 is succeeded by movement therethrough of the next following cable portion which in turn is succeeded by movement through the array of another next following cable portion, etc., although the currents 136b, 136c, 136d (FIG. 9), drawn by the energized electrodes 70b, 70c, 70d are greater in value than the background value therefor, they are essentially steady-state currents, and the net effect of the movement of the cable 20 through the electrode array is merely to carry positive charge away from it at the exit end of the array.

Assume now, however, that a carbonized insulation defect 30c on the surface of the cable (FIGS. 5 and 8) starts to pass through the electrode array 71. The movement of that defect through that array produces the following electrical effects, which do not occur in the absence of such a defect.

As the defect 30c moves beyond its passage through electrode 70a (during which time no interesting effect occurs) into the axial gap between electrodes 70a and 70b, the protuberance of the defect 30c above the surface of the surrounding non-carbonized regions of the cable's outer insulating sheath 25 serves at axially opposite ends of the defect, to provide, on the one hand, a shortened radial gap 140a between electrode 70a and, on the other hand, a shortened radial gap 140b between electrode 70b and that cable as compared to the lengths those gaps would have in the absence of such defect. Moreover, the current conductance of carbonized defect 30c between those axially opposite ends thereof is very high compared to the conductance over the same length of a similar region of the normal uncarbonized insulation in sheath 25. The normal path across axial gap 73a for flow of charge from electrode 70b to electrode 70a is, therefore, supplemented by a much lower resistance shunt path 141b in parallel relation with that normal path and provided by the shortened radial gaps between defect 30c and electrodes 70a and 70b and by the high conductance of defect 30c between those radial gaps.

The formation of that low resistance shunt path between the two electrodes produces in the charge flowing from electrode 70b to electrode 70a a sudden transitory increase or peak which is reflected in, first, a related transitory peak 142b (FIG. 9) in the current drawn by electrode 70b from its converter 110b to support that increased flow charge, and, second, a corresponding increase in the current drawn by transformer 105b from the power supply 96. The increase in the latter current is sensed by current sensor unit 102b and is communicated to peak detector unit 111b. Unit 111b is thresholded so that it responds to the current sensed by unit 102b when the current drawn by electrode 70b exceeds a predetermined magnitude level 143b therefor. The form of that response is the production by unit 111b of the mentioned peak signal pulse which is thereupon entered into as an input to delay line 115b to reappear as a delayed peak signal at the output of the delay line when cable 20 has made a forward advance equal to the distance in path 65 between the axial center of gap 73a and point "r".

It is noted at this point that it is within the purview of the invention hereof to use only electrodes 70a and 70b to detect defect 30c with the mentioned peak signal from detector unit 111b being used alone and, whether delayed or undelayed, as a warning signal to trigger marker device 95 to produce an ink spot on cable 20, or the provide other alarm of the presence of defect 30c on the cable. The use for such purpose of that peak signal when undelayed is practical because the ink spot on the cable will be close enough to the defect 30c thereon that the defect can be easily located from observing the location on the cable of the ink spot.

Figure 9:
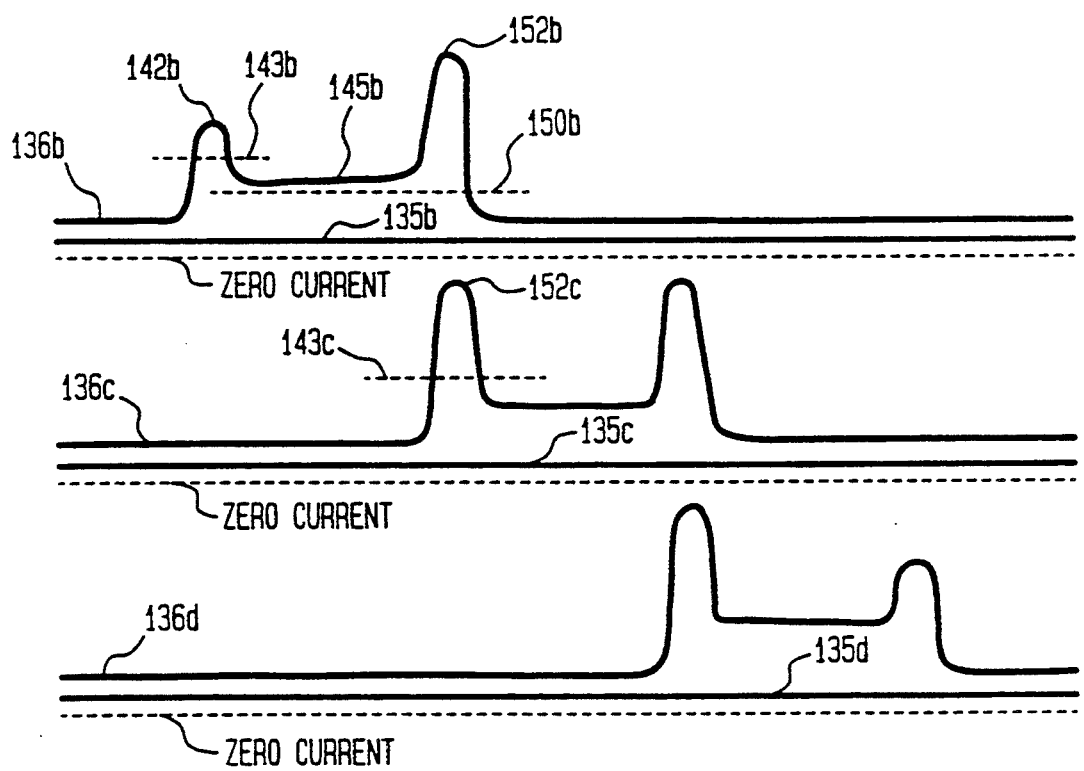
FIG. 9 is a diagram of the magnitudes of the respective currents drawn by the three voltage-charged electrodes of the FIG. 2 apparatus as a black speck passes through the electrode array including those electrodes.

As the movement of cable 20 brings to an end the traversal of gap 73a by defect 30c, the temporary shunt path 141b bridging that gap is eliminated, and the current drawn by electrode 70b decreases from its transitory peak 142b (FIG. 9). The current then does not, however, return to the steady state value which characterizes it when the portion of the moving cable which is within electrode 70b has no defect 30 thereon. Instead, because the defect 30c upon its entry into the interior of electrode 70b provides at the surface of the cable sheath 25 a region which, on account of its high current conductivity, is a better collector and retainer of charge than is the normal insulation of the sheath, the drop from peak 142b in the current drawn by electrode 70b stops at a plateau level 145b (FIG. 9) which is usually higher than the steady state level 136b for that current although substantially lower than the peak 142 thereof. As the defect 30c progresses through the electrode, such current remains at that plateau level (in the absence of saturation of the charge build up on cable 20) until the defect reaches the axial gap 73b.

As earlier mentioned, it is within the purview of the invention for an insulation defect such as 30c to be detected by the use in apparatus 14 of only a single electrode in place of the whole electrode array 71, and which electrode may be the electrode 70b. When the electrode 70b is used as such a "stand-alone" electrode, there is established for the current drawn by that electrode a threshold value 150b (FIG. 9) therefor between the steady state and plateau levels, and, when the magnitude of that current rises above threshold 150b on account of the defect 30c entering and passing through that electrode, the peak detector unit 111b is triggered to produce a peak signal which, whether undelayed or delayed by delay line 115b, is utilized as a working signal and, in that capacity, activates marker device 95 or gives other alarm of the presence of the defect.

Returning to the operation of apparatus 14 when the whole electrode 71 is therein, as the defect comes within axial gap 73b in the course of movement of the cable 20, the presence of the defect in that gap, produces therein a temporary low resistance path which is in shunt with the normal path across that gap for flow of charge between electrodes 70b and 70c, and which path is similar in character to the shunt path 141b previously temporarily produced in axial gap 73a. The formation of that low resistance shunt path in gap 73b causes the currents drawn by electrodes 70b and 70c to have respective transitory peaks 152b and 152c which are similar to the peak 142b already described as occurring in the current drawn by electrode 70b, but which peaks 152b and 152c are greater in magnitude than peak 142b because of the "double value" differential between the voltages on electrodes 70b and 70a. The response of detector unit 111b to the occurrence of peak 152b is locked out from entry into delay line 115b. The detector unit 111c is, however, thresholded to respond by the production of a peak signal to an increase in the current drawn by electrode 70c when that current exceeds a threshold level 143c, and the peak signal produced by detector unit 111c is entered as an input into delay line 115c to reappear at an output therefrom as a delayed peak signal when the cable 20 in its forward movement has made an advance in path 65 approximately equal to the distance from the axial center of axial gap 73b to point "r".

As the defect 30c completes its transverse of axial gap 73b to next proceed through the electrode 70c and then through and beyond the remainder of electrode array 71, additional changes occur (as shown in FIG. 9) in the respective currents drawn by energized electrodes 70b, 70c, and 70d, and how and why those additional changes are produced will be evident from the description already given. When the defect 30c upon leaving array 71 reaches the approximate location of the point "r" in the cable path 65, the peak signals entered into the delay lines 115b, 115c, 115d reappear at the outputs of those lines as delayed peak signals which are fed to comparator 120. If delayed peak signals from all of those delay lines are received by that comparator, and if all of those delayed peak signals are coincident in time within a selectable predetermined range of acceptable departure or discrepancy from exact coincidence, then the comparator is actuated by the meeting of that coincidence condition to trigger marker device 95 to produce an ink spot on the cable 20. If, however, one or more of those delayed peak signals is missing or the respective occurrences of those pulses do not coincide closely enough in time, then the marker device 95 is not triggered by the comparator. The technique described therein of providing delayed peak signals of increases occurring at different times in currents drawn by electrode array 71 because of passage through the array of a cable defect 30, and of comparing by comparator 120 those delayed peak signals for time coincidence, and producing a warning signal only if those delayed signals are closely enough coincident in time, is an expedient which serves to screen out signals derived from the array which are produced by extraneous causes but falsely indicate the presence of a defect 30 in the cable 20. In applications of the invention, however, the use of such screening expedient is not necessary.

The above described embodiment being exemplary only, it is to be understood that additions thereto, omissions therefrom and modifications thereof may be made without departing from the spirit of the invention. As one example, without restriction, the electrodes in array 71 need not each extend all the way around cable path 65, as long as the electrodes are so arranged that all angular extents of such path around its circumference are radially opposite and spaced from portions of one or more of such electrodes. As another such example, the electrode array 71 may be modified to be reduced to grounded electrode 70, energized electrode 70b and grounded electrode 70e as moved to now occupy the place previously occupied by electrode 70c. In that modification, means are provided to cause the peak detector circuit 112c to supply a peak signal pulse to delay line 115c when a transitory peak in the current drawn by electrode 70b is produced by the transversing by a defect in the cable of the axial gap between electrodes 70b and 70e, and the comparator 120 is responsive to acceptable coincidence in time between the delayed peak signal outputs from delay lines 115b and 115c to trigger device 95 to mark the cable 20 by an ink spot.

Accordingly, the invention is not to be considered as limited save as is consonant with the recitals of the following claims.

I claim:

1. Apparatus for testing a thin elongated flexible body of insulation to detect a localized defect thereon of different conductivity than the normal insulation of said body, said apparatus comprising; means defining for said body a predetermined path of movement having an axis, means to impart lengthwise movement to said body in said path along said axis, electrode means surrounding said path to be spaced therefrom by a radial gap extending angularly around said path, energizing means coupled to said electrode means to supply said electrode means with energy in the form of current drawn thereby at high enough DC energizing voltage to produce flow of charge through the atmosphere between said electrode means and said body when moving in said path through said electrode means, sensing means for monitoring said current, and defect detecting means responsive to change in said current induced by the bringing by said moving body of said defects into proximity with said electrode means to produce a warning signal of the presence of such defect, said comprising a plurality of electrodes disposed along said path so that adjacent of said electrodes are spaced by an axial gap, said electrodes each extending around said path to be spaced therefrom by a radial gap, and said energizing means being coupled to said plurality of electrodes to supply to each thereof electrical energy in the form of current at different DC voltages to different ones of said electrodes so as to produce a DC voltage differential between said electrodes.

2. Apparatus according to claim 1 in which adjacent of said electrodes have respective lengths in the axial direction which are greater than the length in that direction of the axial gap between those electrodes.

3. Apparatus according to claim 1 in which said energizing means is designed to supply DC voltages of different polarity to adjacent of said electrodes.

4. Apparatus according to claim 1 in which said plurality of ring electrodes comprise at least three of said electrodes disposed in succession along said path.

5. Apparatus according to claim 4 in which said energizing means is designed to supply DC voltages of different polarity to alternate ones of said electrodes in said succession thereof.

6. Apparatus according to claim 1 in which said energizing means is coupleable to an electrical energy power source of lower voltage than said high DC voltage for deriving from said source said electrical energy supplied by said energizing means to said plurality of electrodes, said sensing means comprises a plurality of current sensing units respectively corresponding to said plurality of ring electrodes and each being responsive to current drawn from said source as a result of flow of charge between the corresponding electrode and said moving body to produce an indication of the rate of flow of that charge, and in which said defect detecting means comprises; a plurality of peak detector units respectively corresponding to said plurality of current sensing units and each being responsive to such an indication from the corresponding sensing unit to produce a peak signal only when the current sensed by that unit undergoes a change exceeding a predetermined threshold value therefor, pulse generator means to sense said movement of said body and generate pulses of which the number generated during a time interval is a function of the advance of said moving body over that interval, a plurality of delay lines respectively corresponding to said peak detector units, each said delay line being responsive to inputs thereto of said peak signal from the corresponding peak detector unit and to said pulses from said pulse generator means to produce a delayed peak signal after a time interval corresponding to the time required for a point on said moving body to travel from the ring electrode corresponding to that peak detector unit to a fixed reference point along said path, and comparator means responsive to the plurality of delayed peak signals from said plurality of delay lines to produce said warning signal only when said delayed peak signals are coincident in time to within a predetermined acceptable range of discrepancy between the respective exact times of occurrence of those signals.

7. A method for testing a thin elongated flexible body of insulation to detect a localized defect thereon of different conductivity than the normal insulation of said body, said method comprising; providing a ring-shaped electrode, moving said body lengthwise through said electrode while maintaining said body spaced from said electrode by a radial gap, supplying said electrode with electrical energy in the form of current drawn by said electrode at high enough DC voltage thereon to produce between said electrode and moving body a flow of charge at a rate reflected in the magnitude of said current, obtaining a running indication over time of the amount of said current as said body moves through said electrode, and responding to change in said current induced by the bringing by said moving body of said defect into proximity with said electrode to produce a warning signal of the presence of said defect, said body of insulation being constituted of organic insulating material, and said defect being a carbonized form of said material having a higher conductivity than the normal form of said material.

8. A method for testing a thin, elongated flexible body of insulation to detect a localized defect thereon of different conductivity than the normal insulation thereof, said method comprising; providing a plurality of ring-shaped electrodes along an axially extending path so that adjacent ones of said electrodes are spaced from such other by an axial gap, moving said body lengthwise along said path in one axial direction to pass said body through said electrodes while maintaining said body spaced all around from each of said electrodes by a radial gap, supplying each of said electrodes with electrical energy in the form of respective currents drawn by said electrodes at respective DC voltages for said electrodes which are high enough to produce between each of said electrodes and said moving body a flow of charge at a rate reflected in the amount of current drawn by that electrode, said respective high voltages for said electrodes being different for adjacent ones of said electrodes to produce a DC voltage differential manifested across said axial gap between said adjacent electrodes, monitoring the respective currents drawn by said plurality of electrodes as said body moves through them along said paths, and responding to a change which occurs in at least one of the respective currents drawn by adjacent ones of said electrodes, and which change is induced by virtue of said defect being caused by said moving body to traverse said axial gap between those electrodes, to derive from said change a warning signal of the existence of said defect.

9. The method according to claim 8 in which said plurality of electrodes comprise at least three electrodes spaced by two axial gaps, said defect traverses one and then the other of said two axial gaps to produce peaks at different times in the currents drawn by said three electrodes, and said method comprising the further step of comparing the respective times of occurrence of said peaks, and producing said warning signal only when that comparing confirms that said current peaks are correlated with the same defect.

10. Apparatus for testing a thin elongated flexible body of insulation to detect a localized defect thereon of different conductivity than the normal insulation of said body, said apparatus comprising, electrode means radially spaced from and extending angularly around an axial path for lengthwise movement of said body past said electrode means, energizing means to supply said electrode means with energy in the form of current drawn thereby at great enough DC voltage to produce between said electrode means and said body as it moves in said path a flow of charge at a rate reflected in the amount of current drawn by said electrode means, means for monitoring said current, and means responsive to change in said current induced by the bringing by the movement of said body in said path of said defect into proximity with said electrode means to produce a warning signal of the presence of said defect, said electrode means comprising two adjacent electrodes spaced from each other by an axial gap, and said energizing means being coupled to said electrode means for developing between said adjacent electrodes a DC voltage differential great enough to produce flow of charge across said gap between said adjacent electrodes.

11. Apparatus according to claim 10 in which one of said adjacent electrodes is grounded.

12. Apparatus according to claim 10 in which said energizing means is coupled to said electrode means to develop on said adjacent electrodes respective DC voltages of opposite polarity relative to ground.

* * * * *